(12) United States Patent
Faguet et al.

(10) Patent No.: US 8,163,087 B2
(45) Date of Patent: Apr. 24, 2012

(54) PLASMA ENHANCED ATOMIC LAYER DEPOSITION SYSTEM AND METHOD

(75) Inventors: Jacques Faguet, Albany, NY (US);
Frank M. Cerio, Jr., Schenectady, NY (US); Tsukasa Matsuda, Delmar, NY (US); Kaoru Yamamoto, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 2206 days.

(21) Appl. No.: 11/094,461

(22) Filed: Mar. 31, 2005

(65) Prior Publication Data

US 2006/0225655 A1  Oct. 12, 2006

(51) Int. Cl.
C23C 16/00 (2006.01)

(52) U.S. Cl. ........................................ 118/715
(58) Field of Classification Search ............ 118/715
See application file for complete search history.

(56) References Cited

U.S. PATENT DOCUMENTS

| | | | |
|---|---|---|---|
| 5,135,629 A * | 8/1992 | Sawada et al. ............ 204/192.12 |
| 6,220,204 B1 | 4/2001 | Makino et al. |
| 6,274,058 B1 * | 8/2001 | Rajagopalan et al. .......... 216/67 |
| 6,420,279 B1 | 7/2002 | Ono et al. |
| 6,495,000 B1 * | 12/2002 | Atkinson et al. ......... 204/192.12 |
| 6,596,343 B1 * | 7/2003 | Pokharna et al. .......... 427/248.1 |
| 7,175,713 B2 * | 2/2007 | Thakur et al. ................. 118/715 |
| 2002/0144786 A1 * | 10/2002 | Chiang et al. ............ 156/345.51 |
| 2003/0116087 A1 | 6/2003 | Nguyen et al. |
| 2003/0172872 A1 * | 9/2003 | Thakur et al. ................. 118/715 |
| 2003/0221621 A1 * | 12/2003 | Pokharna et al. ............. 118/722 |
| 2004/0224504 A1 | 11/2004 | Gadgil |
| 2005/0008779 A1 | 1/2005 | Yang et al. |
| 2005/0040033 A1 * | 2/2005 | Liu et al. ................... 204/192.15 |
| 2005/0051857 A1 | 3/2005 | Kawahara et al. |
| 2005/0284574 A1 * | 12/2005 | Tanaka et al. ............. 156/345.33 |
| 2006/0148247 A1 * | 7/2006 | Liu et al. ........................ 438/643 |
| 2006/0189171 A1 * | 8/2006 | Chua et al. ..................... 438/800 |
| 2006/0225655 A1 * | 10/2006 | Faguet et al. ............. 118/723 R |
| 2007/0095285 A1 * | 5/2007 | Thakur et al. ................. 118/715 |

* cited by examiner

*Primary Examiner* — Jeffrie R Lund
(74) *Attorney, Agent, or Firm* — Oblon, Spivak, McClelland, Maier & Neustadt, L.L.P.

(57) ABSTRACT

A plasma enhanced atomic layer deposition (PEALD) method and system, the system including a process chamber and a substrate holder provided within the processing chamber and configured to support a substrate on which a predetermined film will be formed. A first process material supply system is configured to supply a first process material to the process chamber, and a second process material supply system configured to supply a second process material to the process chamber in order to provide a reduction reaction with the first process material to form the predetermined film on the substrate. Also included is a power source configured to couple electromagnetic power to the process chamber to generate a plasma within the process chamber to facilitate the reduction reaction, and a chamber component exposed to the plasma and made from a film compatible material that is compatible with the predetermined film deposited on the substrate.

11 Claims, 7 Drawing Sheets

PLASMA ENHANCED ATOMIC LAYER DEPOSITION SYSTEM AND METHOD

BACKGROUND OF THE INVENTION

1. Field of Invention

The present invention relates to a plasma enhanced atomic layer deposition system and method, and more particularly to a plasma enhanced atomic layer deposition system and method configured to provide an atomic layer deposition film having reduced contamination problems.

2. Description of Related Art

Typically, during materials processing, plasma is employed to facilitate the addition and removal of material films when fabricating composite material structures. For example, in semiconductor processing, a (dry) plasma etch process is utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of PECVD or more generally CVD, has emerged as a candidate for ultra-thin gate film formation in front end-of-line (FEOL) operations, as well as ultra-thin barrier layer and seed layer formation for metallization in back end-of-line (BEOL) operations. In ALD, two or more process gasses are introduced alternatingly and sequentially in order to form a material film one monolayer at a time. Such an ALD process has proven to provide improved uniformity and control in layer thickness, as well as conformality to features on which the layer is deposited. However, current ALD processes often suffer from contamination problems that affect the quality of the deposited films, and thus the manufactured device. Such contamination problems have been an impediment to wide acceptance of ALD films despite their superior characteristics.

SUMMARY OF THE INVENTION

Accordingly, one object of the present invention is directed to addressing any of the above-described and/or other problems with ALD systems and processes.

Another object of the present invention is to reduce contamination problems relating to deposition of ALD films.

These and/or other objects of the present invention may be provided by a plasma enhanced atomic layer deposition (PEALD) system having a process chamber and a substrate holder provided within the processing chamber and configured to support a substrate on which a predetermined film will be formed. A first process material supply system is configured to supply a first process material to the process chamber, and a second process material supply system configured to supply a second process material to the process chamber in order to provide a reduction reaction with the first process material to form the predetermined film on the substrate. Also included is a power source configured to couple electromagnetic power to the process chamber to generate a plasma within the process chamber to facilitate the reduction reaction, and a chamber component exposed to the plasma and made from a film compatible material that is compatible with the predetermined film deposited on the substrate.

Another aspect of the invention includes a plasma enhanced atomic layer deposition (PEALD) system having a process chamber and means provided within the processing chamber for supporting a substrate on which a predetermined film will be formed. Also included is means for supplying a first process material to the processing chamber, and means for supplying a second process material to the processing chamber in order to provide a reduction reaction with the first process material to form the predetermined film on the substrate. Further included in this aspect is means for coupling electromagnetic power to the processing chamber to generate a plasma within the processing chamber to facilitate the reduction reaction, and means for reducing sputter contamination of the predetermined film deposited on the substrate.

Still another aspect of the invention is a method for depositing a film on a substrate using plasma enhanced atomic layer deposition (PEALD) process. The method includes identifying a predetermined film to be deposited using the PEALD process and selecting a PEALD process chamber comprising a component made from a material compatable with the predetermined film. The PEALD process is performed in the selected PEALD process chamber to deposit the predetermined film.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
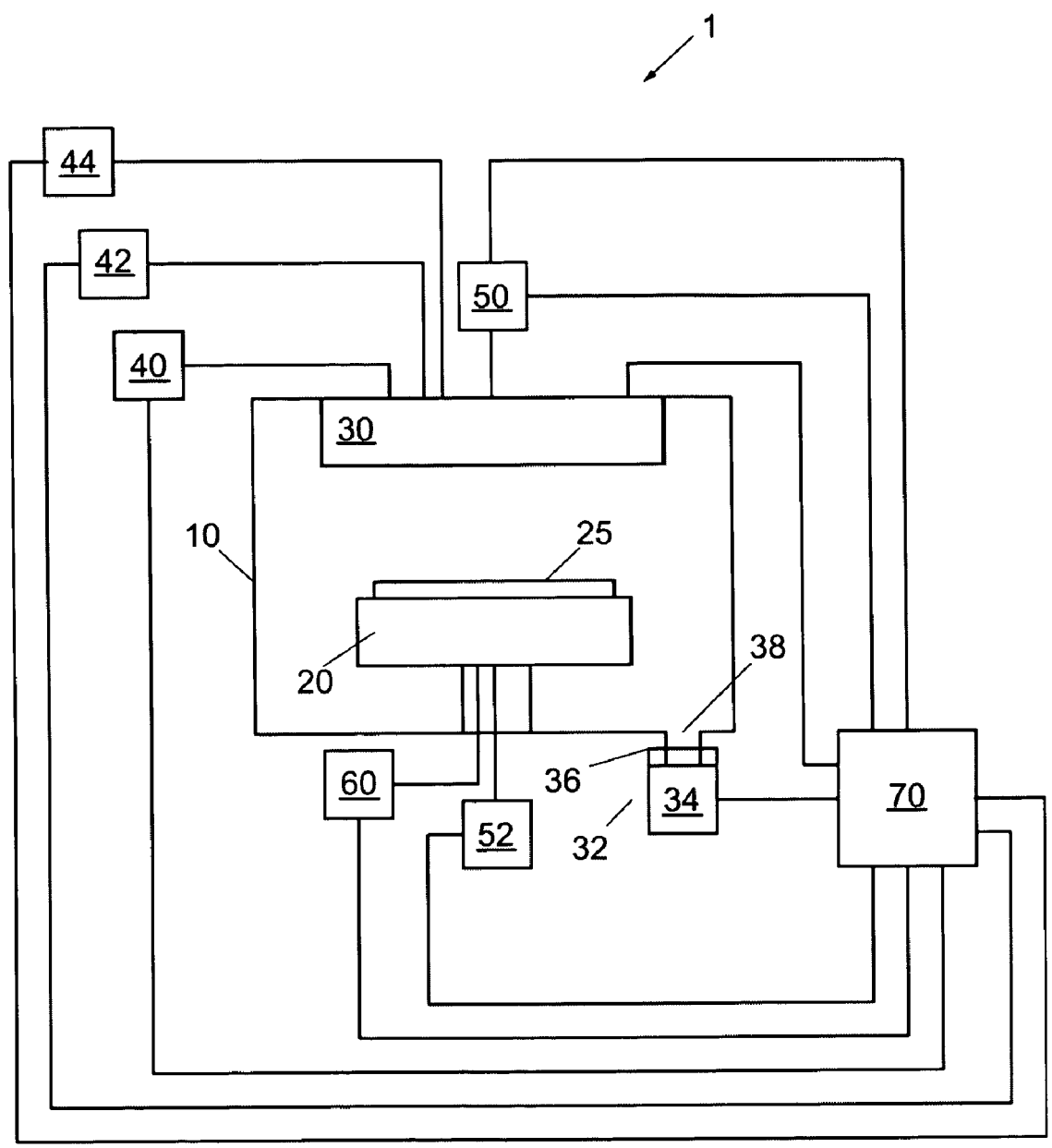
FIG. 1 depicts a schematic view of a deposition system in accordance with an embodiment of the invention.

Referring now to the drawings, wherein like reference numerals designate identical or corresponding parts throughout the several views, FIG. 1 illustrates a deposition system 1 for depositing a thin film on a substrate according to one embodiment. For example, during the metallization of interconnect and intra-connect structures for semiconductor devices in back-end-of-line (BEOL) operations, a thin conformal barrier layer may be deposited on wiring trenches or vias to minimize the migration of metal into the inter-level or intra-level dielectric. Further, a thin conformal seed layer may be deposited on wiring trenches or vias to provide a film with acceptable adhesion properties for bulk metal fill, or a thin conformal adhesion layer may be deposited on wiring trenches or vias to provide a film with acceptable adhesion properties for metal seed deposition. In front-end-of line (FEOL) operations, the deposition system 1 may be used to deposit an ultra thin gate layer, and/or a gate dielectric layer such as a high-K film.

The deposition system 1 comprises a process chamber 10 having a substrate holder 20 configured to support a substrate 25, upon which the thin film is formed. The process chamber 10 further comprises an upper assembly 30 coupled to a first process material supply system 40, a second process material supply system 42, and a purge gas supply system 44. Additionally, the deposition system 1 comprises a first power source 50 coupled to the process chamber 10 and configured to generate plasma in the process chamber 10, and a substrate temperature control system 60 coupled to substrate holder 20 and configured to elevate and control the temperature of substrate 25. Additionally, deposition system 1 comprises a controller 70 that can be coupled to process chamber 10, substrate holder 20, upper assembly 30, first process material supply system 40, second process material supply system 42, purge gas supply system 44, first power source 50, and substrate temperature control system 60.

Alternately, or in addition, controller 70 can be coupled to one or more additional controllers/computers (not shown), and controller 70 can obtain setup and/or configuration information from an additional controller/computer.

In FIG. 1, singular processing elements (10, 20, 30, 40, 42, 44, 50, and 60) are shown, but this is not required for the invention. The deposition system 1 can comprise any number of processing elements having any number of controllers associated with them in addition to independent processing elements.

The controller 70 can be used to configure any number of processing elements (10, 20, 30, 40, 42, 44, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Referring still to FIG. 1, the deposition system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternatingly and cyclically introduce a first process material to process chamber 10 and a second process material to process chamber 10. The first process material can, for example, comprise a film precursor, such as a composition having the principal atomic or molecular species found in the film formed on substrate 25. For instance, the film precursor can originate as a solid phase, a liquid phase, or a gaseous phase, and it may be delivered to process chamber 10 in a gaseous phase with or without the use of a carrier gas. The second process material can, for example, comprise a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas.

Additionally, the purge gas supply system 44 can be configured to introduce a purge gas to process chamber 10 between introduction of the first process material and the second process material to process chamber 10, respectively. The purge gas can comprise an inert gas, such as a Noble gas (i.e., helium, neon, argon, xenon, krypton). The purge gas supply system 44 can also be configured to introduce a reactive purge gas.

Referring still to FIG. 1, the deposition system 1 comprises a plasma generation system configured to generate a plasma during at least a portion of the alternating and cyclical introduction of the first process material and the second process material to process chamber 10. The plasma generation system can include a first power source 50 coupled to the process chamber 10, and configured to couple power to the first process material, or the second process material, or both in process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in plasma process chamber 10 by reducing the reflected power. Match network topologies (e.g. L-type, π-type, T-type, etc.) and automatic control methods are well known to those skilled in the art.

Alternatively, the first power source 50 may include a radio frequency (RF) generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

Optionally, the deposition system 1 comprises a substrate bias generation system configured to generate or assist in generating a plasma during at least a portion of the alternating and cyclical introduction of the first process material and the second process material to process chamber 10. The substrate bias system can include a substrate power source 52 coupled to the process chamber 10, and configured to couple power to substrate 25. The substrate power source 52 may include a radio frequency (RF) generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz. RF bias systems for plasma processing are well known to those skilled in the art. Alternately, RF power is applied to the substrate holder electrode at multiple frequencies.

Although the plasma generation system and the optional substrate bias system are illustrated in FIG. 1 as separate entities, they may indeed comprise one or more power sources coupled to substrate holder 20.

Still referring to FIG. 1, deposition system 1 comprises substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 120 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the processing chamber 10 and any other component within the deposition system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 120 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 34 is configured to controllably evacuate the process chamber 10 to a pressure suitable for forming the thin film on substrate 25, and suitable for use of the first and second process materials. Moreover, the pressure control system 32 may be coupled to a sealing assembly in accordance with an embodiment of the present invention, as will be discussed in relation to FIG. 4 below.

The vacuum pumping system 34 can include a turbo-molecular vacuum pump (TMP) capable of a pumping speed up to about 5000 liters per second (and greater) and valve 36 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.).

Still referring to FIG. 1, controller 70 can comprise a microprocessor, memory, and a digital I/O port capable of generating control voltages sufficient to communicate and activate inputs to deposition system 1 as well as monitor outputs from deposition system 1. Moreover, the controller 70 may be coupled to and may exchange information with the process chamber 10, substrate holder 20, upper assembly 30, first process material supply system 40, second process material supply system 42, purge gas supply system 44, first power source 50, second power source 52, substrate temperature controller 60, and pressure control system 32. For example, a program stored in the memory may be utilized to activate the inputs to the aforementioned components of the deposition system 1 according to a process recipe in order to perform an etching process, or a deposition process. One example of the controller 70 is a DELL PRECISION WORKSTATION 610™, available from Dell Corporation, Austin, Tex.

The controller 70 may be locally located relative to the deposition system 1, or it may be remotely located relative to the deposition system 1. For example, the controller 70 may exchange data with the deposition 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 2:
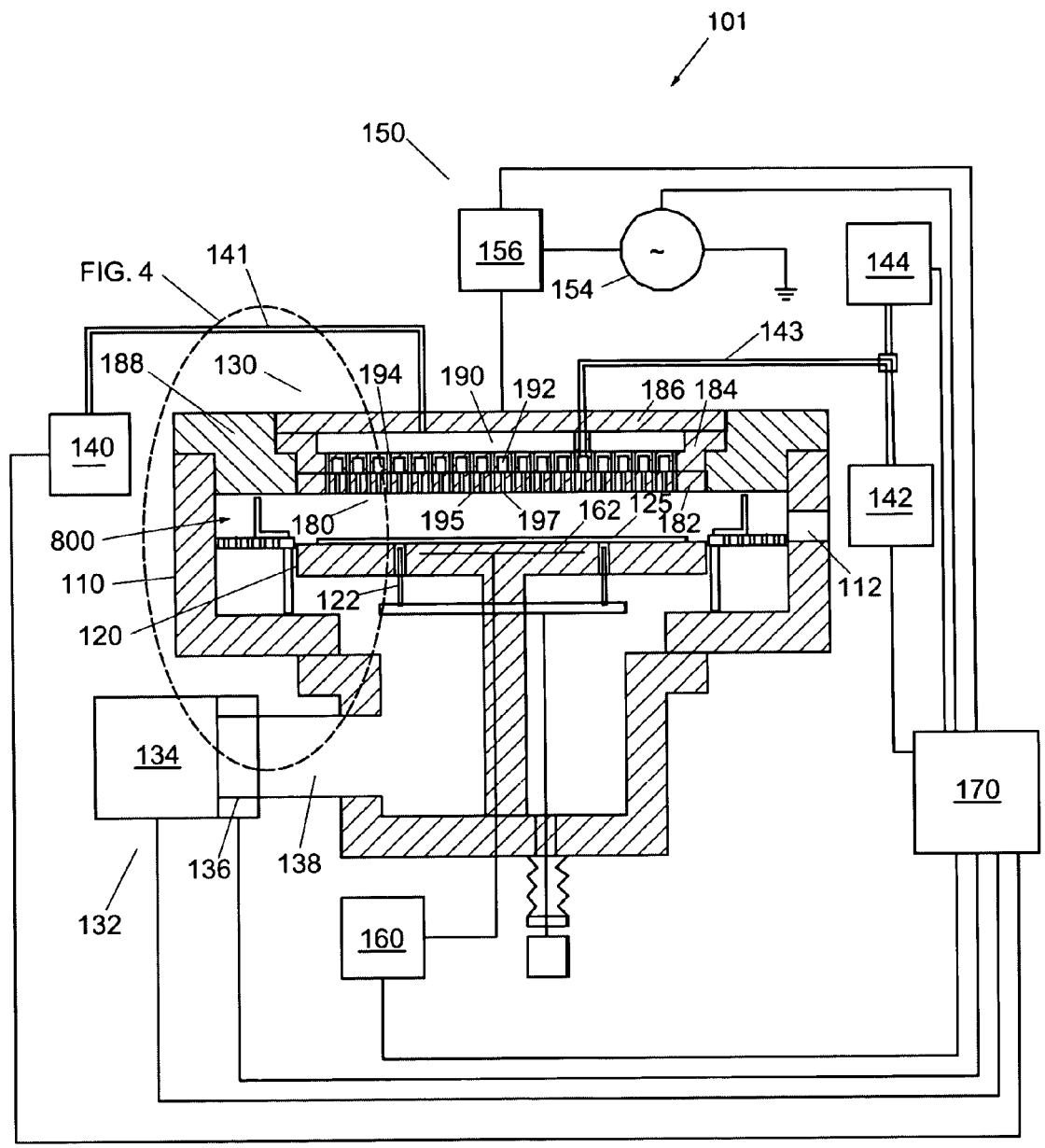
FIG. 2 depicts a schematic view of a deposition system in accordance with another embodiment of the invention.

Referring now to FIG. 2, there is shown a deposition system 101 on which embodiments of the present invention may be implemented. The deposition system 101 of FIG. 2 comprises a process chamber 110 having a substrate holder 120 configured to support a substrate 125, upon which the thin film is formed. As seen within the dashed oval of FIG. 2, the process chamber 110 includes process chamber wall 115 coupled to a separate upper assembly 130 and a separate lower assembly 135. As also seen in FIG. 2, the process system may include a contamination shield assembly 800 to help reduce the amount of external contaminants from reaching the substrate surface. The upper assembly 130 is coupled to a first process material supply system 140, a second process material supply system 142, and a purge gas supply system 144. Additionally, the deposition system 101 comprises a first power source 150 coupled to the process chamber 110 and configured to generate plasma in the process chamber 110, and a substrate temperature control system 160 coupled to substrate holder 120 and configured to elevate and control the temperature of substrate 125. Additionally, deposition system 101 comprises a controller 170 that can be coupled to process chamber 110, substrate holder 120, upper assembly 130, first process material supply system 140, second process material supply system 142, purge gas supply system 144, first power source 150, and substrate temperature control system 160. The controller 170 may be implemented, for example, as the controller 70 described with respect to FIG. 1 above.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to process chamber 110 through passage 112, and they may be lifted to and from an upper surface of substrate holder 120 via substrate lift system 122.

The first process material supply system 140 and the second process material supply system 142 are configured to alternatingly and cyclically introduce a first process material to process chamber 110 and a second process material to process chamber 110. The first process material can, for example, comprise a film precursor, such as a composition having the principal atomic or molecular species found in the film formed on substrate 125. For instance, the film precursor can originate as a solid phase, a liquid phase, or a gaseous phase, and it may be delivered to process chamber 10 in a gaseous phase, and with or without a carrier gas. The second process material can, for example, comprise a reducing agent, which may also have atomic or molecular species found in the film formed on substrate 125. For instance, the reducing agent can originate as a solid phase, a liquid phase, or a gaseous phase, and it may be delivered to process chamber 110 in a gaseous phase, and with or without a carrier gas.

Additionally, the purge gas supply system 144 can be configured to introduce a purge gas to process chamber 110 between introduction of the first process material and the second process material to process chamber 110, respectively. The purge gas can comprise an inert gas, such as a Noble gas (i.e., helium, neon, argon, xenon, krypton). In one embodiment, the purge gas supply system 144 can also be configured to introduce a reactive purge gas into chamber 110 as will be further described herein.

The first material supply system 140, the second material supply system 142, and the purge gas supply system 144 can include one or more material sources, one or more pressure control devices, one or more flow control devices, one or more filters, one or more valves, or one or more flow sensors. As discussed with respect to FIG. 1, the flow control devices can include pneumatic driven valves, electro-mechanical (solenoidal) valves, and/or high-rate pulsed gas injection valves. An exemplary pulsed gas injection system is described in greater detail in pending U.S. application Ser. No. 60/272, 452, filed on Mar. 2, 2001, the entire contents of which is incorporated herein by reference in its entirety.

Referring still to FIG. 2, the first process material is coupled to process chamber 110 through first material line 141, and the second process material is coupled to process chamber 110 through second material line 143. Additionally, the purge gas may be coupled to process chamber 110 through the first material line 141 (as shown), the second material line 143 (as shown), or an independent line, or any combination thereof. In the embodiment of FIG. 2, the first process material, second process material, and purge gas are introduced and distributed within process chamber 110 through the upper assembly 130 that includes gas injection assembly 180. While not shown in FIG. 2, a sidewall gas injection valve may also be included in the processing system. The gas injection assembly 180 may comprise a first injection plate 182, a second injection plate 184, and a third injection plate 186, which are electrically insulated from process chamber 110 by insulation assembly 188. The first process material is coupled from the first process material supply system 140 to process chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both is coupled from the second process material supply system 142 or purge gas supply system 144 to process chamber 110 through a second array of orifices 197 in the first injection plate 182 via a second plenum 192 formed in the second injection plate 184.

Referring still to FIG. 2, the deposition system 101 comprises a plasma generation system configured to generate a plasma during at least a portion of the alternating and cyclical introduction of the first process material and the second process material to process chamber 110. The plasma generation system can include a first power source 150 coupled to the process chamber 110, and configured to couple power to the first process material, or the second process material, or both in process chamber 110. The first power source 150 may be variable and includes a radio frequency (RF) generator 154 and an impedance match network 156, and further includes an electrode, such as gas injection assembly 180, through which RF power is coupled to plasma in process chamber 110. The electrode is formed in the upper assembly 130 and is insulated from process chamber 110 via insulation assembly 188, and it can be configured to oppose the substrate holder 120. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz.

Still referring to FIG. 2, deposition system 101 comprises substrate temperature control system 160 coupled to the substrate holder 120 and configured to elevate and control the temperature of substrate 125. Substrate temperature control system 160 comprises at least one temperature control element, including a resistive heating element such as an aluminum nitride heater. The substrate temperature control system 160 can, for example, be configured to elevate and control the substrate temperature up to from approximately 350° to 400° C. Alternatively, the substrate temperature can, for example, range from approximately 150° C. to 350° C. It is to be understood, however, that the temperature of the substrate is selected based on the desired temperature for causing ALD deposition of a particular material on the surface of a given substrate. Therefore, the temperature can be higher or lower than described above.

Furthermore, the process chamber 110 is further coupled to a pressure control system 132, including a vacuum pumping system 134 and a valve 136, through a duct 138, wherein the pressure control system 134 is configured to controllably evacuate the process chamber 110 to a pressure suitable for forming the thin film on substrate 125, and suitable for use of the first and second process materials.

Figure 3:
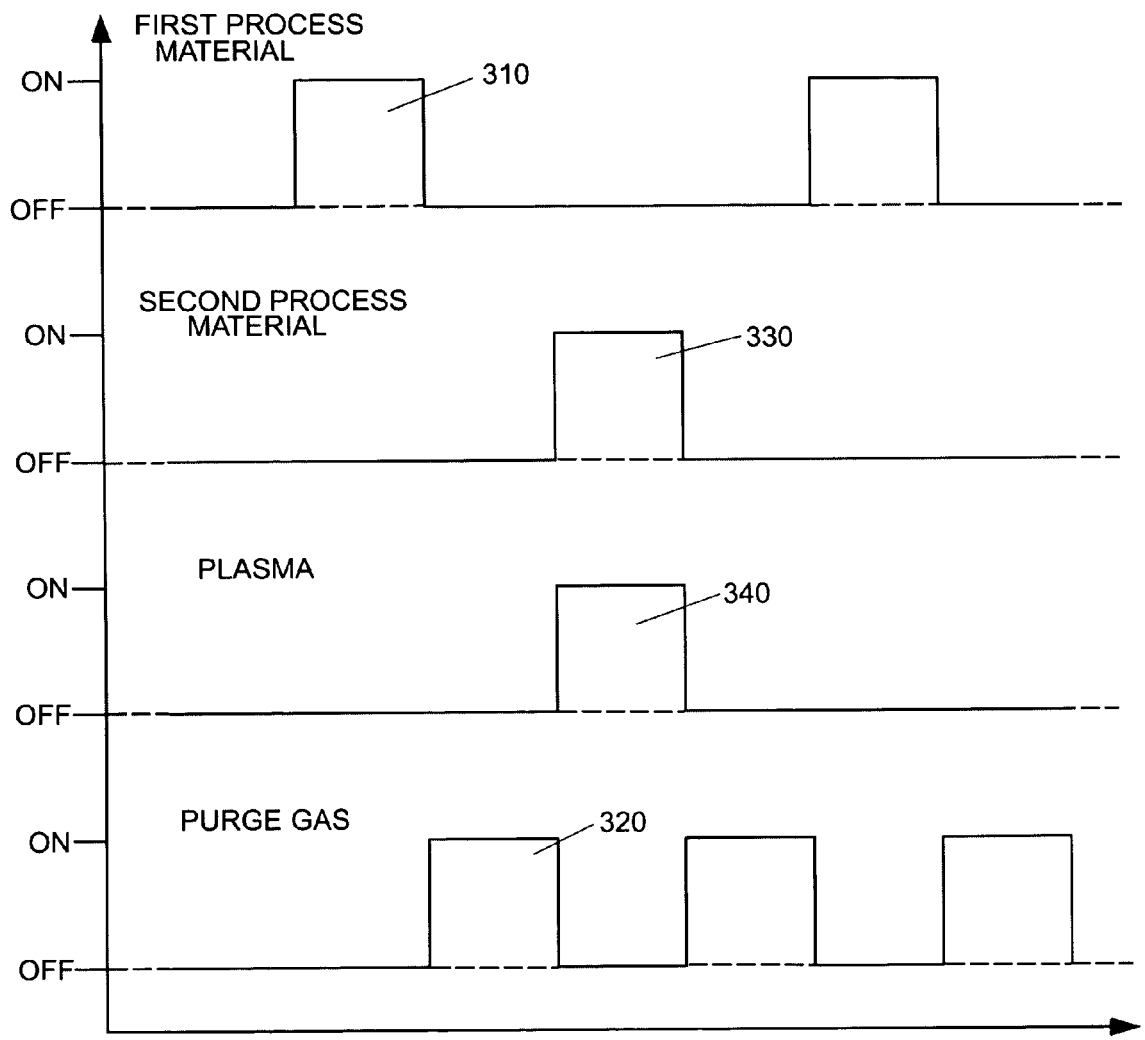
FIG. 3 is a timing diagram for an exemplary ALD process according to an embodiment of the invention.

FIG. 3 is a timing diagram for an exemplary plasma enhanced atomic layer deposition (PEALD) process that may be performed in a PEALD processing system in accordance with an embodiment of the present invention. As seen in this figure, a first process material is introduced to a process chamber, such as the chamber 10 or 110 (components noted by 10/110 below), for a first period of time 310 in order to deposit such material on exposed surfaces of substrate 25/125. The first process material is preferably a chemically volatile but thermally stable material that can be deposited on the substrate surface in a self limiting manner. The nature of such deposition depends on the composition of the first process material and the substrate being processed. For example, the first process material can be either or both of absorbed or chemically bonded with the substrate surface.

In the embodiment of FIG. 3, after the first process material is deposited on the substrate surface, the process chamber 10/110 is purged with a purge gas for a second period of time 320. Thereafter, a reducing agent (second process material), is introduced to process chamber 10/110 for a third period of time 330 while power is coupled through the upper assembly 30/130 from the first power source 50/150 to the reducing agent as shown by 340. The second process material is provided in the processing chamber to provide a reduction reaction with the deposited first process material in order to form a desired film on the substrate surface. Thus, the second process material preferably reacts aggressively with the first process material deposited on the substrate. The coupling of power to the reducing agent heats the reducing agent, thus causing ionization and dissociation of the reducing agent in order to form a radical that chemically reacts with the first precursor adsorbed (and/or bonded) on substrate 25/125. When substrate 25/125 is heated to an elevated temperature, the surface chemical reaction facilitates the formation of the desired film. The process chamber 10/110 is then purged with a purge gas for a fourth period of time. The introduction of the first and second process materials, and the formation of plasma can be repeated any number of times to produce a film of desired thickness on the substrate.

While FIG. 3 shows discrete pulses of the first process material, the first process material may be a continuous flow, for example on a carrier gas, where such continuous flow will not cause undesirable reaction with the second process material prior to deposition on the substrate surface. While FIG. 3 shows plasma generation only during the reduction gas period, a plasma may also be generated during the first process material period in order to facilitate adsorption and/or chemical bonding of the first process material to the substrate surface. Moreover, although the second process material time period 330 and the plasma time period 340 are shown in FIG. 3 to exactly correspond to one another, it is sufficient for purposes of the present invention that such time periods merely overlap, as would be understood by one of ordinary skill in the art.

As discussed in the Related Art section above, one impediment to wide acceptance of ALD processes has been the contamination problems associated therewith. For example, it is known that byproducts from the ALD process materials, such as chlorine, can remain in the processing chamber and contaminate the ALD film layer. U.S. patent application Ser. No. 11/083,899 and titled A PLASMA ENHANCED ATOMIC LAYER DEPOSITION SYSTEM AND METHOD filed on Mar. 21, 2005, discusses several methods of reducing such contamination in the processing chamber. In addition, U.S. patent application Ser. No. 11/090,256 and titled A PLASMA ENHANCED ATOMIC LAYER DEPOSITION SYSTEM filed on Mar. 28, 2005 discusses several methods of reducing external contaminants from reaching the ALD film. The entire content of these applications is incorporated herein by reference. The present inventors have recognized, however, that contamination may also result from internal chamber components themselves.

Specifically, the present inventors have recognized that generation of a plasma to enhance the ALD process, in particular a high power plasma, can lead to the appearance of contaminants in the film arising from sputtering of process chamber components by ionized contaminants. For instance, when depositing a tantalum film, $TaCl_5$ is reduced on the substrate surface using a hydrogen plasma and HCl evolves from the surface. In the presence of the plasma, HCl dissociates to form ionized chlorine, etc., which is a large ion capable of sputtering process chamber components (as opposed to smaller ions such as hydrogen ions). As the plasma power is increased, the sheath voltage adjacent process chamber components can exceed the sputtering threshold for the material composition of the process chamber component.

For example, the electrode 30, 130, as depicted in FIGS. 1 and 2, can be fabricated from a corrosion resistant material, such as nickel (having a sputtering threshold voltage of approximately 143 V) when using chlorine containing materials. As such, a high power plasma can sputter the nickel and contaminate a deposited ALD film. Moreover, the present inventors have recognized that even small amounts of such contaminants can have an undesirable effect on PEALD films, which are typically ultra thin and have critical characteristics that must be maintained for optimum device quality and operation. For example, sputter contaminants can reduce the density of deposited films resulting in poor film characteristics such as resistivity or dielectric constant.

Based on recognition of these problems, the present inventors have discovered that the effects of sputter contamination on ALD films can be reduced by depositing the ALD film in a chamber having at least one component that is exposed to the plasma being made from a material compatible with the ALD film itself. As used herein, the term "made from a material compatible with the ALD film" means that the chamber component has at least a surface material that includes at least one molecular or atomic component in common with or compatible with the ALD film being deposited. Returning to the example above, where the ALD film is a tantalum containing material, a chamber component that may contribute to sputter contamination can be entirely made from or coated with a tantalum containing material. As such, any sputtering of the chamber component will result in the tantalum containing material from the component being deposited along with the tantalum of the process material. This reduces the affects of the contamination because the sputtered material has compatible characteristics with the deposited film.

Figure 4:
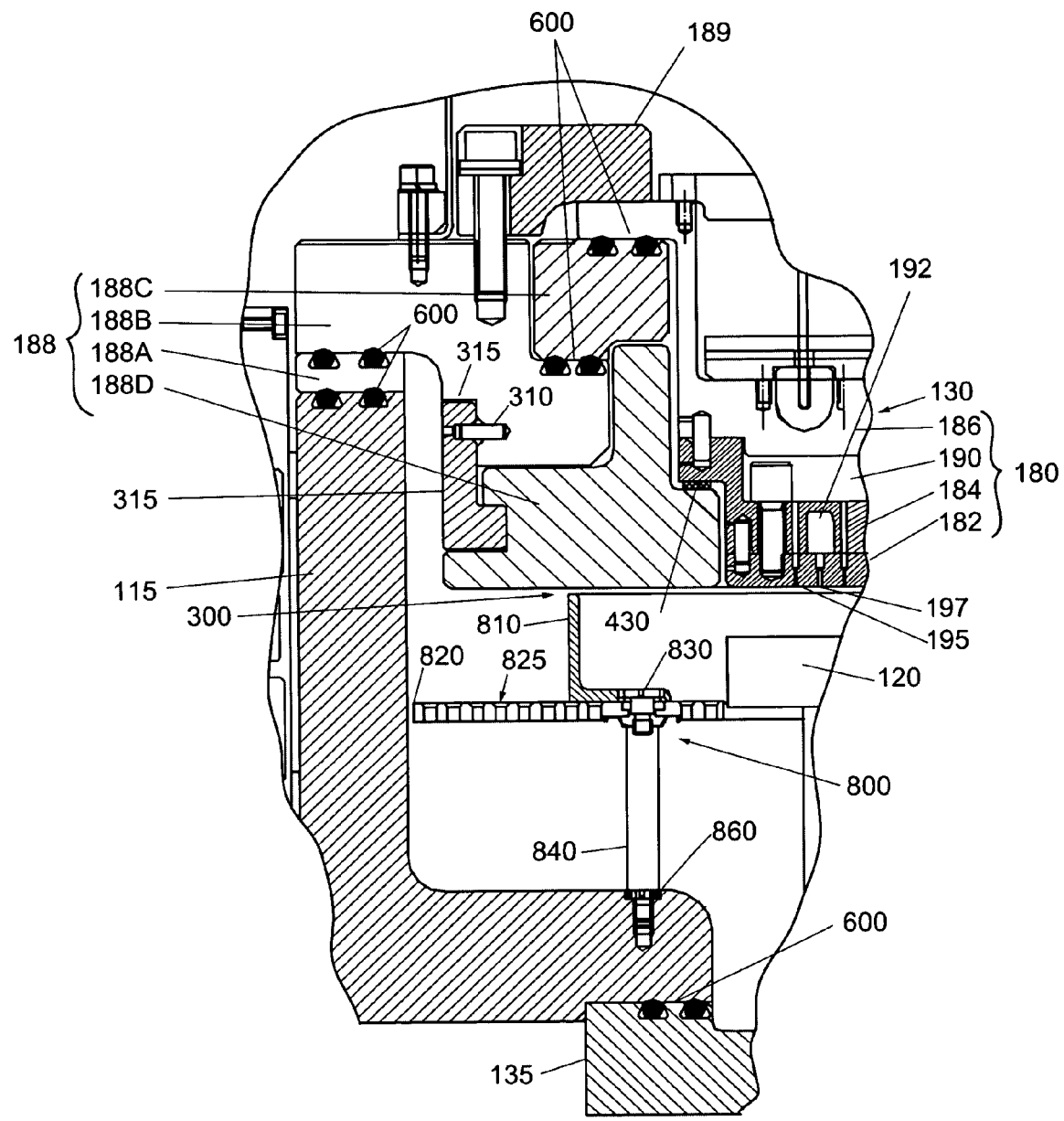
FIG. 4 is a magnified view of a portion of a processing chamber of FIG. 2, showing details of components that may include a process compatible material in accordance with the present invention.

FIG. 4 is a magnified view of a portion of a processing chamber of FIG. 2, showing details of chamber components that may be made from a material compatible with a predetermined film to be deposited in accordance with an embodiment of the present invention. Specifically, FIG. 4 shows the processing chamber sidewall portion 115 coupled to the showerhead assembly 180 by way of insulating member 188. The showerhead assembly 180 includes items 182, 184, 186, 190, 192, 195 and 197 described with respect to FIG. 2, and described only as necessary with respect to FIG. 4. In the embodiment of FIG. 4, the insulating assembly 188 includes spacer ring 188A, sidewall joining member 188B, an upper showerhead joining member 188C and a lower showerhead joining member 188D. One or more of these components of the insulating member 188 comprises an insulating material such as alumina or quartz in order to provide electrical insulation between the showerhead assembly 180 and the chamber sidewall 115, which are typically conductive. However, components of the insulating member 188 may be non-insulating as long as the sidewall 115 is electrically insulated from the showerhead assembly 180.

In the embodiment of FIG. 4, the spacer ring 188A is interposed between an upper surface of the chamber sidewall 115, and a lower surface of the sidewall joining member 188B. In one embodiment, the sidewall joining member 188B carries the weight of the showerhead assembly 180 and rests on the upper surface of the spacer ring 188A to provide pressure contact between the sidewall 115, spacer ring 188A and sidewall joining member 188B. In another embodiment, the pressure contact may be facilitated by a clamping device not shown in FIG. 4.

The sidewall joining member 188B is coupled to the lower showerhead joining member 188D by use of some number of fixing pins 310 and retaining ring 315. The retaining ring 315 is typically metal, but can be made of other materials. As seen in FIG. 4, the fixing pin 310 and retaining ring 315 hold a right angle surface of the lower showerhead joining member 188D in contact with a corner edge of the sidewall joining member 188B. Similarly, a corner edge of the upper showerhead joining member 188C rests in a right angle surface of the sidewall joining member 188B to maintain contact therebetween. As also shown in FIG. 4, the showerhead assembly 180 is maintained in contact with the upper showerhead joining member 188C and the lower showerhead joining member 188D by a clamping member 189 and a bond 430 respectively. As also see in FIG. 4, several adjacent parts of the chamber include sealing members 600 interposed therebetween to help reduce the amount of contaminants that enter the chamber from an exterior of the chamber.

Also included in the embodiment of FIG. 4 is a shield assembly 800, which includes a shield member 810, a baffle plate 820 and a mounting mechanism 840. The shield assembly 800 helps reduce the amount of external contaminants that can reach the substrate surface. In the embodiment of FIG. 4, the shield assembly 800 is fixed to a lower horizontal portion of the sidewall 115 by mounting screw 860 projecting from the bottom of the mounting mechanism 840. As with the shield member 810, the mounting mechanism 840 is cylindrical in shape, and preferably includes a plurality of mounting screws 860 positioned circumferentially around the mounting mechanism 840. Alternately mounting mechanism 40 may have some finite number of cylindrical posts, each with mounting threads projecting from the bottom. In alternate embodiments, the shield may be mounted to the chamber by other means such as coupling to the vertical portion of the chamber sidewall 115, coupling to the lower assembly 135 and/or coupling to the upper assembly 130. Moreover, the shield assembly 800 may be coupled to the substrate holder 120 rather than the processing chamber itself.

Baffle plate 820 is coupled to a top end of the mounting mechanism 840. The baffle plate 820 is positioned substantially at a right angle to the mounting mechanism 840 and extends toward the sidewall 115 of the processing chamber. As seen in FIG. 4, the baffle plate 820 includes a plurality of through holes 825 that allow process gas flow through the baffle plate so that the substrate region can be evacuated. In the embodiment of FIG. 4, the shield member 810 has an L-shaped cross section, the horizontal portion of which rests on the baffle plate 820. A mounting screw 830 extends through the L-shaped shield 810 and the baffle plate 820 to engage the top of the mounting mechanism 840. Thus, the shield 810 functions as an integral unit of the shield assembly 800 coupled to the sidewall 115.

In the embodiment of FIG. 4, the substrate holder 120, the gas injection plate 180, the shield assembly 800, and the lower showerhead joining member 188D, for example, are all exposed to a plasma in the processing chamber. Thus, any or all of these components may be made from or coated with a material compatible with a material of a film deposited on a substrate in the process chamber. It is to be understood, however, that FIG. 4 is only an exemplary embodiment and other components exposed to the plasma can include a film compatible material in accordance with the invention. For example, at least one of an electrode, a shower head, a grid, a focus ring, a dispersion plate, a gas injector, a shield, a clamp ring, a wafer lift pin, a wafer centering ring, an alignment rail, a paddle, a door, a hanger, a hinge, a holder, a gas diffuser, a chuck, a screw, a nut, or a bolt can be made from (for example coated with) a film compatible material in accordance with the present invention.

The selection of a film compatible material for a chamber component in accordance with an embodiment of the invention depends on the predetermined film that will be deposited in the PEALD chamber. Moreover, the first process material and the second process material are chosen in accordance with the composition and characteristics of the predetermined film to be deposited on the substrate. For example, during the deposition of tantalum (Ta) as a barrier layer, the first process material can include a solid film precursor, such as tantalum pentachloride ($TaCl_5$), and the second process material can include a reducing agent, such as hydrogen ($H_2$) gas. In another example, during the deposition of tantalum nitride (TaN) or tantalum carbonitride (TaCN) as a barrier layer, the first process material can include a metal organic film precursor, such as tertiary amyl imido-tris-dimethylamido tantalum ($Ta(NC(CH_3)_2C_2H_5)(N(CH_3)_2)_3$, hereinafter referred to as Taimata®; for additional details, see U.S. Pat. No. 6,593,484), and the second process material can include a reducing agent, such as hydrogen ($H_2$), ammonia ($NH_3$), silane ($SiH_4$), or disilane ($Si_2H_6$), or a combination thereof. In another example, when depositing tantalum nitride (i.e., $TaN_x$), the first precursor can include a tantalum-containing precursor, such as $TaCl_5$, PDEAT (pentakis(diethylamido)tantalum), PEMAT (pentakis(ethylmethylamido)tantalum), $TaBr_5$, or TBTDET (t-butylimino tris(diethylamino)tantalum). The second precursor can include a mixture of $H_2$ and $N_2$, or $NH_3$. Still further, when depositing tantalum pentoxide, the first process material can include $TaCl_5$, and the second process material can include $H_2O$, or $H_2$ and $O_2$.

In one example, when depositing tantalum (Ta), tantalum nitride, or tantalum carbonitride, the first process material can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$, and the second process material can include $H_2$, $NH_3$, $N_2$ and $H_2$, $N_2H_4$, $NH(CH_3)_2$, or $N_2H_3CH_3$.

In another example, when depositing titanium (Ti), titanium nitride, or titanium carbonitride, the first process material can include $TiF_4$, $TiCl_4$, $TiBr_4$, $TiI_4$, $Ti[N(C_2H_5CH_3)]_4$ (TEMAT), $Ti[N(CH_3)2]4$ (TDMAT), or $Ti[N(C_2H_5)_2]_4$ (TDEAT), and the second process material can include $H_2$, $NH_3$, $N_2$ and $H_2$, $N_2H_4$, $NH(CH_3)_2$, or $N_2H_3CH_3$.

As another example, when depositing tungsten (W), tungsten nitride, or tungsten carbonitride, the first process material can include $WF_6$, or $W(CO)_6$, and the second process material can include $H_2$, $NH_3$, $N_2$ and $H_2$, $N_2H_4$, $NH(CH_3)_2$, or $N_2H_3CH_3$.

In another example, when depositing molybdenum (Mo), the first process material can include molybdenum hexafluoride ($MoF_6$), and the second process material can include $H_2$.

When depositing copper, the first process material can include organometallic compounds, such as Cu(TMVS)(hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The second process material can include at least one of $H_2$, $O_2$, $N_2$, $NH_3$, or $H_2O$. As used herein, the term "at least one of A, B, C, . . . or X" refers to any one of the listed elements or any combination of more than one of the listed elements.

In another example, when depositing $ZrO_2$, the first process material can include $Zr(NO_3)_4$, or $ZrCl_4$, and the second process material can include $H_2O$.

When depositing $HfO_2$, the first process material can include $Hf(OBu^t)_4$, $Hf(NO_3)_4$, or $HfCl_4$, and the second process material can include $H_2O$. In another example, when depositing hafnium (Hf), the first process material can include $HfCl_4$, and the second process material can include $H_2$.

In still another example, when depositing niobium (Nb), the first process material can include niobium pentachloride ($NbCl_5$), and the second process material can include $H_2$.

In another example, when depositing zinc (Zn), the first process material can include zinc dichloride ($ZnCl_2$), and the second process material can include $H_2$.

In another example, when depositing $SiO_2$, the first process material can include $Si(OC_2H_5)_4$, $SiH_2Cl_2$, $SiCl_4$, or $Si(NO_3)_4$, and the second process material can include $H_2O$ or $O_2$. In another example, when depositing silicon nitride, the first process material can include $SiCl_4$, or $SiH_2Cl_2$, and the second process material can include $NH_3$, or $N_2$ and $H_2$. In another example, when depositing TiN, the first process material can include titanium nitrate ($Ti(NO_3)$), and the second process material can include $NH_3$.

In another example, when depositing aluminum, the first process material can include aluminum chloride ($Al_2Cl_6$), or trimethylaluminum ($Al(CH_3)_3$), and the second process material can include $H_2$. When depositing aluminum nitride, the first process material can include aluminum trichloride, or trimethylaluminum, and the second process material can include $NH_3$, or $N_2$ and $H_2$. In another example, when depositing aluminum oxide, the first process material can include aluminum chloride, or trimethylaluminum, and the second process material can include $H_2O$, or $O_2$ and $H_2$.

In another example, when depositing GaN, the first process material can include gallium nitrate ($Ga(NO_3)_3$), or trimethylgallium ($Ga(CH_3)_3$), and the second process material can include $NH_3$.

As any of the above listed films may be a predetermined film to be deposited by a PEALD process, the compatible material on a chamber component may be a material that is compatible with any of the predetermined films listed above.

Figure 5:
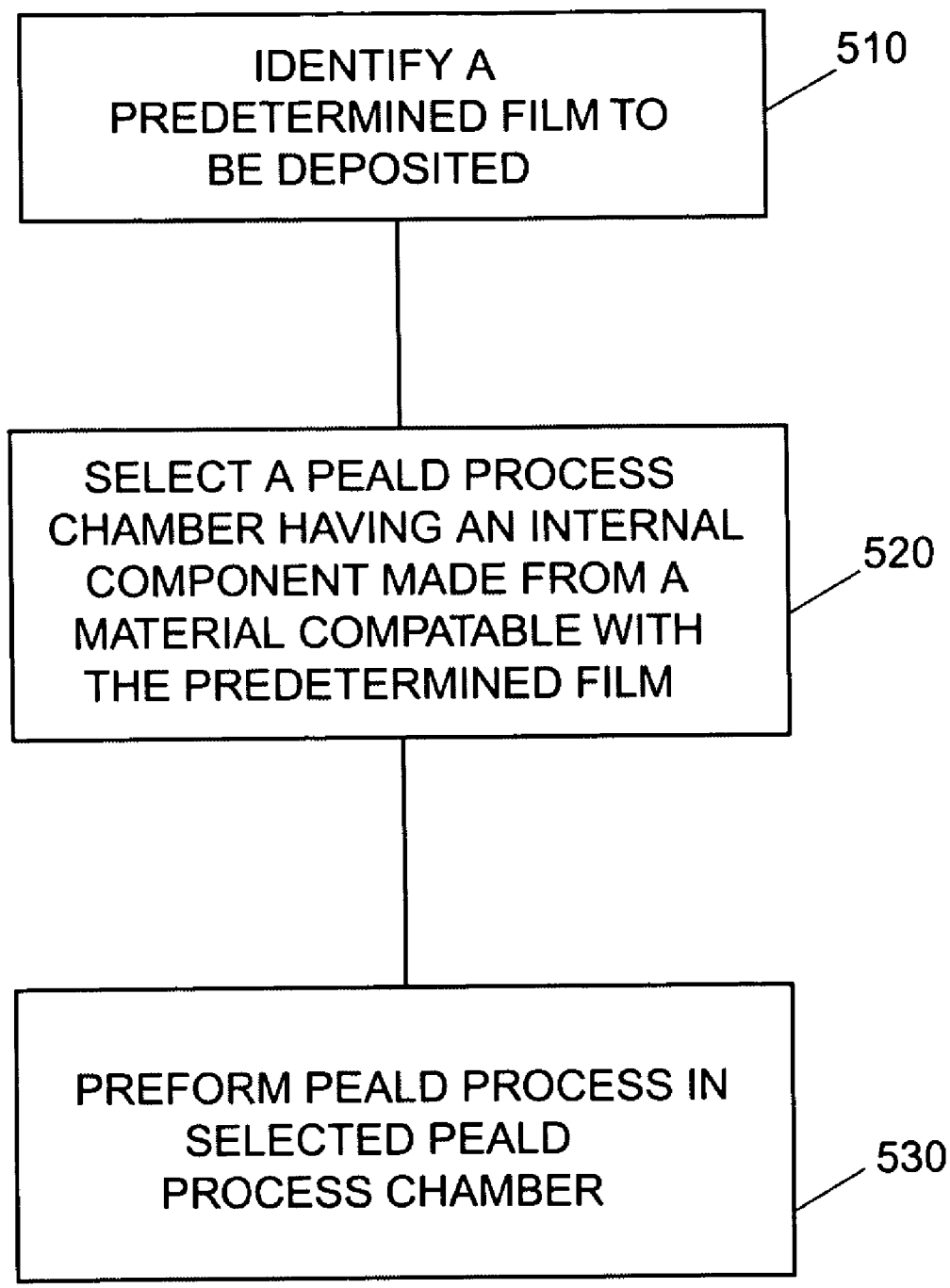
FIG. 5 shows a flow diagram of a process in accordance with the present invention.

FIG. 5 shows a process for depositing a layer of material on a substrate surface in accordance with the present invention. In step 510, a predetermined ALD film is identified by an operator. For example, when forming semiconductor devices on a substrate, an ultra-thin barrier layer of tantalum may be identified as a film to be deposited by a PEALD process. As would be understood by those skilled in the art, any of the above-described films may be identified as part of step 510. This identification of a predetermined film allows selection of a process chamber in accordance with step 520.

Specifically, step 520 includes selecting a PEALD process system having at least one internal component made from a material compatible with the predetermined film to be deposited. The process system of step 520 may be the process system 1 of FIG. 1, the process system 101 of FIG. 2 or any other PEALD process system, as long as at least one component exposed to a plasma in the process system is made from a film compatible material. Moreover, the process system may be a general us process system that is modified in step 520 to include a chamber component made from a film compatible material in accordance with the present invention. Thus, with the tantalum example provided above, the film compatible material may include tantalum.

In step 530, the PEALD process is performed within the process system selected in step 520. The PEALD process of step 530 may be the process described with respect to FIG. 3, or any other known PEALD process. During the PEALD process, the plasma generated may cause a sputtering effect on the chamber components exposed to the plasma as described above. However, because at least one of the internal chamber components is made from a process compatible material, the sputtered material that reaches the ALD layer deposited will not have a severe effect on the deposited material, as also discussed above.

Figure 6:
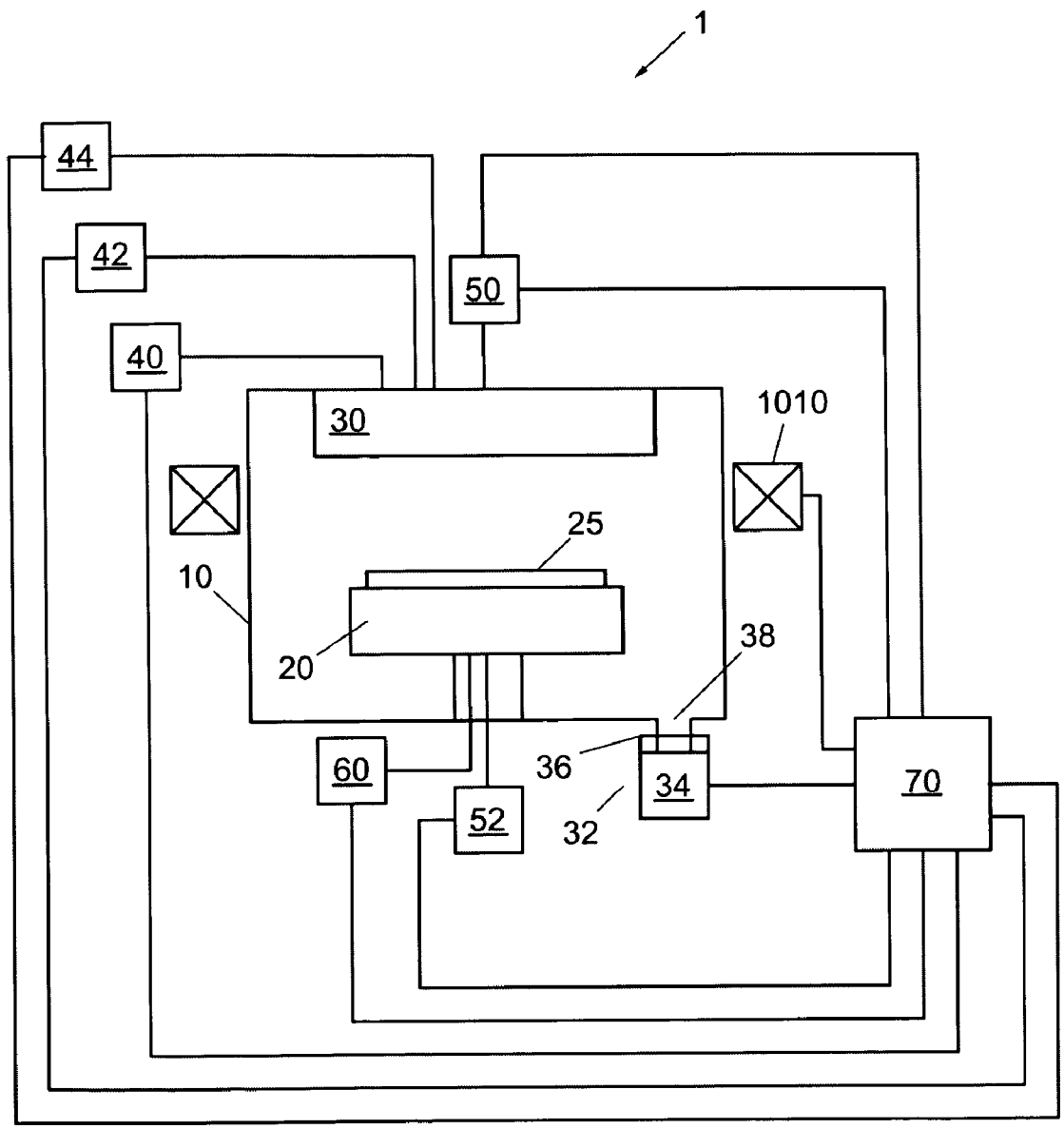
FIG. 6 shows a PEALD plasma processing system according to another embodiment of the present invention.

While embodiments of the present invention have been described with respect to processing chambers 1 and 101, the present invention may be implemented on other PEALD chamber configurations. For example, FIG. 6 shows a PEALD plasma processing system according to another embodiment of the present invention. The plasma processing system 1 of this figure is similar to that of FIG. 1, except the system of FIG. 6 includes a RF plasma source comprising either a mechanically or electrically rotating DC magnetic field system 1010. Such a structure may be used to potentially increase plasma density and/or improve plasma processing uniformity. Moreover, the controller 70 is coupled to the rotating magnetic field system 1010 in order to regulate the speed of rotation and field strength.

Figure 7:
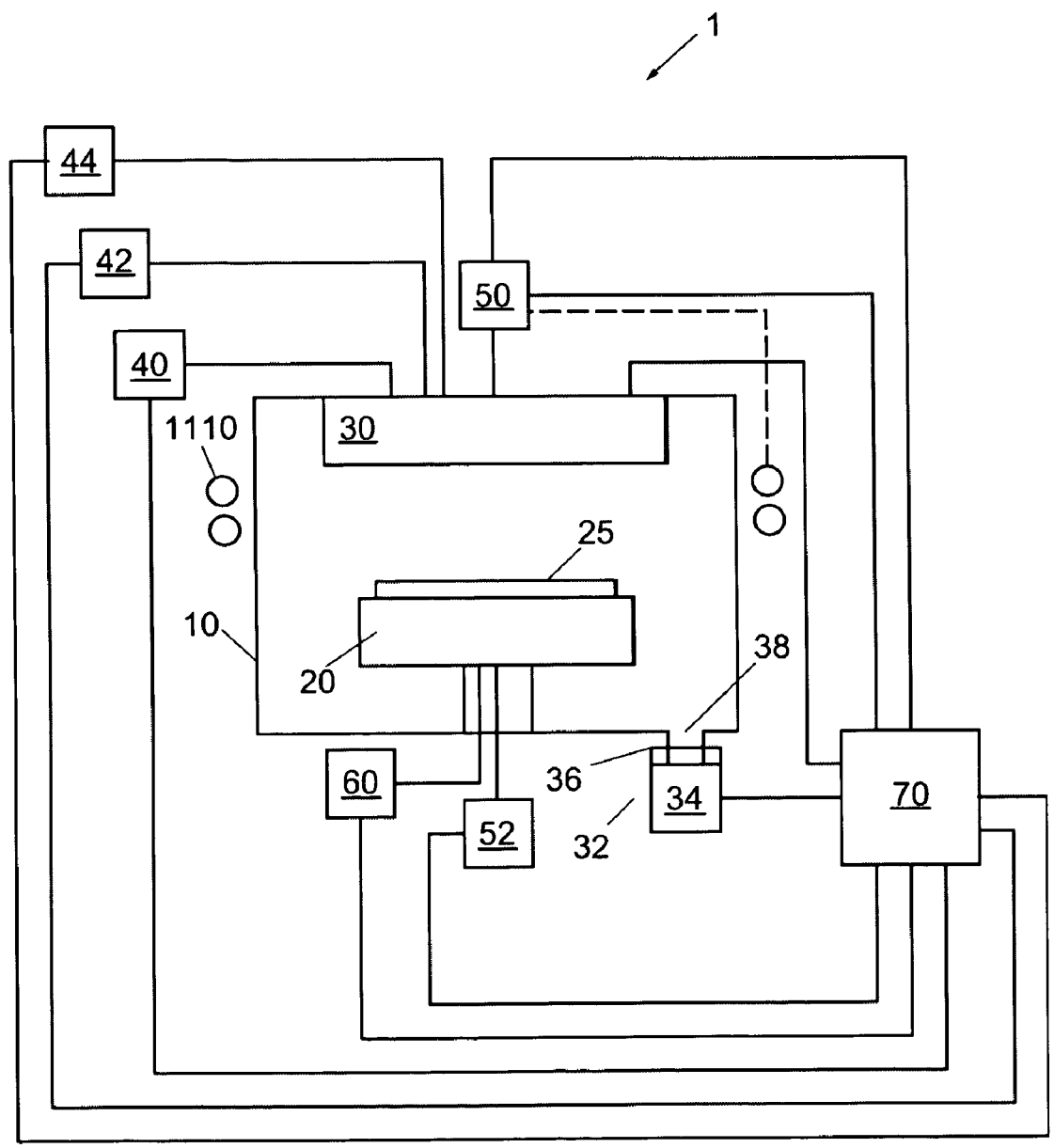
FIG. 7 shows a PEALD plasma processing system according to yet another embodiment of the present invention.

FIG. 7 shows a PEALD plasma processing system according to yet another embodiment of the present invention. The plasma processing system 1 of this figure is similar to that of FIG. 1, except the system of FIG. 6 includes a RF plasma source comprising an inductive coil 1110 to which RF power is coupled via a power source 50. RF power is inductively coupled from the inductive coil 1110 through a dielectric window (not shown) to the plasma-processing region above the substrate 25. A typical frequency for the application of RF power to the inductive coil 1110 ranges from 0.1 MHz to 100 MHz and can be 13.56 MHz. The RF power applied to the inductive coil can be between about 50 W and about 10000 W. Similarly, a typical frequency for the application of power to the chuck electrode ranges from 0.1 MHz to 30 MHz and can be 13.56 MHz. The RF power applied to the substrate holder can be between about 0 W and about 1000 W. In addition, a slotted Faraday shield (not shown) can be employed to reduce capacitive coupling between the inductive coil 80 and plasma. Moreover, the controller 70 is coupled to the power source 50 in order to control the application of power to the inductive coil 1110.

Although only certain exemplary embodiments of inventions have been described in detail above, those skilled in the art will readily appreciate that many modifications are possible in the exemplary embodiments without materially departing from the novel teachings and advantages of this invention. For example, various techniques have been disclosed herein for reducing contamination of ALD films. Any combination or all of these features can be implemented in a single PEALD processing system. Accordingly, all such modifications are intended to be included within the scope of this invention.

The invention claimed is:

1. A plasma enhanced atomic layer deposition (PEALD) system comprising:
   a process chamber;
   a substrate holder provided within said processing chamber and configured to support a substrate on which a predetermined film will be formed;
   a first process material supply system configured to supply a first process material to said process chamber;
   a second process material supply system configured to supply a second process material to said process chamber in order to provide a reduction reaction with said first process material to form said predetermined film on said substrate;
   a power source configured to couple electromagnetic power to the process chamber to generate a plasma within said process chamber to facilitate said reduction reaction; and a chamber component exposed to said plasma and made from a film compatible material having at least one molecular component in common with said predetermined film,
wherein the chamber component is one of a wafer lift pin, a wafer centering ring, a alignment rail, a paddle, a hanger, a hinge, a holder, a chuck, a screw, a nut, and a bolt.

2. The PEALD system of claim 1, wherein said chamber component comprises a gas injection plate.

3. The PEALD system of claim 1, wherein said chamber component comprises a substrate holder.

4. The PEALD system of claim 1, wherein said chamber component comprises a contaminant shield.

5. The PEALD system of claim 1, wherein said chamber component also comprises at least one of an electrode, a shower head, a grid, a focus ring, a dispersion plate, a gas injector, a shield, a clamp ring, a door, and a gas a diffuser.

6. The PEALD system of claim 1, wherein said chamber component is coated with said film compatible material.

7. The PEALD system of claim 1, wherein said chamber component consists essentially of said film compatible material.

8. The PEALD system of claim 1, wherein said predetermined film comprises tantalum and said film compatible material comprises tantalum.

9. The system of claim 1, wherein said first process material supply system is configured to introduce a first process material comprising at least one of $TaF_5$, $TaCl_5$, $TaBr_5$, $TaI_5$, $Ta(CO)_5$, PEMAT, PDMAT, PDEAT, TBTDET, $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, $TiF_4$, $TiCl_4$, $TiBr_4$, $TiI_4$, TEMAT, TDMAT, TDEAT, $Ti(NO_3)$, $WF_6$, $W(CO)_6$, $MOF_6$, Cu(TMVS)(hfac), CuCl, $Zr(NO_3)_4$, $ZrCl_4$, $Hf(OBut)_4$, $Hf(NO_3)_4$, $HfCl_4$, $NbCl_5$, $ZnCl_2$, $Si(OC_2H_5)_4$, $Si(NO_3)_4$, $SiCl_4$, $SiH_2Cl_2$, $Al_2Cl_6$, $Al(CH_3)_3$, $Ga(CH_3)_3$.

10. The system of claim 1, wherein said second process material supply system is configured to introduce a second process material comprising at least one of $H_2$, $N_2$, $O_2$, $H_2O$, $NH_3$, $H_2O_2$, $SiH_4$, $Si_2H_6$, $NH(CH_3)_2$, or $N_2H_3CH_3$.

11. A plasma enhanced atomic layer deposition (PEALD) system comprising:
a process chamber;
means provided within said processing chamber for supporting a substrate on which a predetermined film will be formed;
means for supplying a first process material to said processing chamber;
means for supplying a second process material to said processing chamber in order to provide a reduction reaction with said first process material to form said predetermined film on said substrate;
means for coupling electromagnetic power to the processing chamber to generate a plasma within said processing chamber to facilitate said reduction reaction; and
means for reducing sputter contamination of said predetermined film deposited on said substrate, said means having at least one molecular component in common with said predetermined film,
wherein the chamber component is one of a wafer lift pin, a wafer centering ring, a alignment rail, a paddle, a hanger, a hinge, a holder, a chuck, a screw, a nut, and a bolt.

* * * * *